United States Patent
Su et al.

(10) Patent No.: US 9,634,105 B2
(45) Date of Patent: Apr. 25, 2017

(54) SILICON NANO-TIP THIN FILM FOR FLASH MEMORY CELLS

(71) Applicant: Taiwan Semiconductor Manufacturing Co., Ltd., Hsin-Chu (TW)

(72) Inventors: Tsu-Hui Su, Taipei (TW); Chih-Ming Chen, Hsinchu (TW); Chia-Shiung Tsai, Hsin-Chu (TW); Chung-Yi Yu, Hsin-Chu (TW); Szu-Yu Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/596,487

(22) Filed: Jan. 14, 2015

(65) Prior Publication Data
US 2016/0204212 A1    Jul. 14, 2016

(51) Int. Cl.
| | |
|---|---|
| *H01L 29/788* | (2006.01) |
| *H01L 29/423* | (2006.01) |
| *H01L 29/66* | (2006.01) |
| *H01L 29/792* | (2006.01) |
| *H01L 21/28* | (2006.01) |

(52) U.S. Cl.
CPC .. *H01L 29/42348* (2013.01); *H01L 21/28273* (2013.01); *H01L 29/42328* (2013.01); *H01L 29/66825* (2013.01); *H01L 29/66833* (2013.01); *H01L 29/7883* (2013.01); *H01L 29/7885* (2013.01); *H01L 29/792* (2013.01)

(58) Field of Classification Search
CPC ......... H01L 29/42324; H01L 29/66825; H01L 31/03845; H01L 31/0384; H01L 31/035218; H01L 29/42348
See application file for complete search history.

(56) References Cited

U.S. PATENT DOCUMENTS

| | | | |
|---|---|---|---|
| 6,320,784 B1 * | 11/2001 | Muralidhar | H01L 29/7887 257/E29.301 |
| 7,595,528 B2 | 9/2009 | Duan et al. | |
| 8,404,302 B2 * | 3/2013 | Maa | H01L 31/0236 427/126.3 |
| 8,951,864 B2 | 2/2015 | Wang et al. | |

(Continued)

FOREIGN PATENT DOCUMENTS

| | | |
|---|---|---|
| KR | 1020060070886 | 6/2006 |
| KR | 1007989500000 | 1/2008 |
| KR | 1020130038103 | 4/2013 |

OTHER PUBLICATIONS

Hsu et al, "Wafer scale . . . etching", APL 93, 133109, (2008).*

*Primary Examiner* — Jerome Jackson, Jr.

(74) *Attorney, Agent, or Firm* — Eschweiler & Potashnik, LLC

(57) ABSTRACT

A quantum nano-tip (QNT) thin film, such as a silicon nano-tip (SiNT) thin film, for flash memory cells is provided to increase erase speed. The QNT thin film includes a first dielectric layer and a second dielectric layer arranged over the first dielectric layer. Further, the QNT thin film includes QNTs arranged over the first dielectric layer and extending into the second dielectric layer. A ratio of height to width of the QNTs is greater than 50 percent. A QNT based flash memory cell and a method for manufacture a SiNT based flash memory cell are also provided.

10 Claims, 17 Drawing Sheets

(56) References Cited

U.S. PATENT DOCUMENTS

| | | | | |
|---|---|---|---|---|
| 2009/0111229 A1* | 4/2009 | Steimle et al. | ........ | B82Y 10/00 438/261 |
| 2012/0252171 A1* | 10/2012 | Shroff | ............... | H01L 29/66825 438/129 |
| 2013/0298977 A1* | 11/2013 | Chen | ...................... | B82Y 30/00 136/255 |
| 2013/0328118 A1* | 12/2013 | Quek | ................. | G11C 16/0416 257/315 |

* cited by examiner

US 9,634,105 B2

SILICON NANO-TIP THIN FILM FOR FLASH MEMORY CELLS

BACKGROUND

Flash memory is an electronic non-volatile computer storage medium that can be electrically erased and reprogrammed. It is used in a wide variety of commercial and military electronic devices and equipment. To store information, flash memory includes an addressable array of flash memory cells. Common types of flash memory cells include stacked-gate flash memory cells and split-gate flash memory cells. Split-gate flash memory cells have several advantages over stacked-gate flash memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
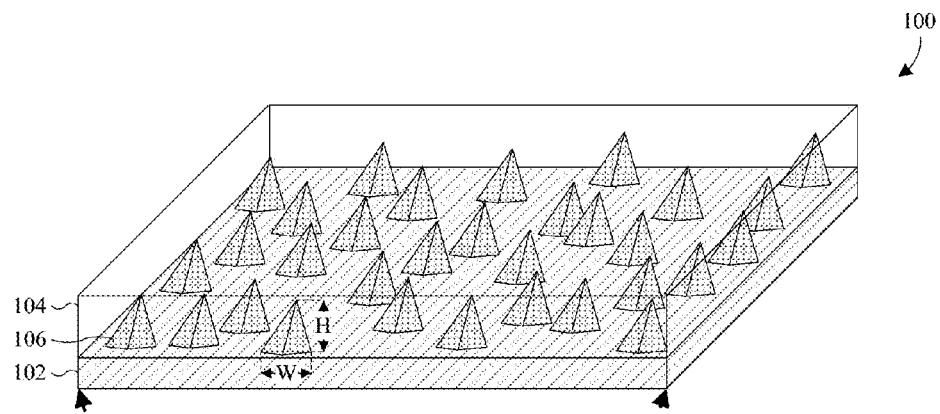
FIG. 1 illustrates a perspective view of some embodiments of a quantum nano-tip (QNT) thin film for split-gate flash memory cells.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

A common type of split-gate flash memory cell includes a control gate and a select gate spaced over a top surface of a semiconductor substrate between a pair of source/drain regions of the semiconductor substrate. Arranged between the select gate and the semiconductor substrate, a select gate dielectric layer provides electrical isolation. Arranged between the control gate and the semiconductor substrate, a charge trapping dielectric layer provides electrical isolation and stores a variable amount of charge representing a unit of data.

For next generation split-gate flash memory cells (i.e., split-gate flash memory cells fabricated in the 32 nanometer technology node or a smaller technology node), a silicon nano-dot (SiND) thin film is being explored for use as the charge trapping dielectric layer. A SiND thin film includes a bottom oxide layer, a top oxide layer arranged over the bottom oxide layer, and SiNDs arranged between the top and bottom oxide layers. During use of a SiND based split-gate flash memory cell, program operations are performed using source-side injection (SSI) and erase operations are performed using Fowler-Nordheim tunneling (FNT). SSI is used to tunnel hot electrons from an inversion channel region underlying the select and control gates to the control gate. As the electrons tunnel, the electrons become trapped on the SiNDs. FNT is used to dislodge the electrons from the SiNDs and to tunnel the dislodged electrons to the control gate.

A shortcoming with SiND based split-gate flash memory cells is that the program speed is significantly faster than the erase speed (e.g., about 100 times faster) since SSI tunnels electrons more efficiently than FNT. Therefore, the present application is directed to a thin film for increasing the efficiency of FNT, as well a method for manufacturing the thin film and a split-gate flash memory cell using the thin film. The thin film includes a bottom oxide layer, a top oxide layer arranged over the bottom oxide layer, and silicon nano-tips (SiNTs) arranged between the top and bottom oxide layers. The SiNTs culminate at points proximate to the control gate, and typically have a pyramid or cone shape. The points concentrate the electric field generated during an erase operation, and therefore increase the efficiency of FNT (i.e., increase the likelihood of FNT). Advantageously, the increase in efficiency can be used to increase erase speed or to reduce the electric field strength.

With reference to FIG. 1, a perspective view 100 of a quantum nano-tip (QNT) thin film is provided. The QNT thin film includes a bottom, tunneling dielectric layer 102 and a top, blocking dielectric layer 104. The top dielectric layer 104 is arranged over the bottom dielectric layer 102, and typically has a bottom surface abutting a top surface of the bottom dielectric layer 102. The top and bottom dielectric layers 102, 104 may be, for example, an oxide, such as silicon dioxide. Further, the bottom dielectric layer 102 may have a thickness of, for example, less than about 100 Angstroms, and the top dielectric layer 104 may have a thickness of, for example, less than about 200 Angstroms.

QNTs 106 are spaced over the top surface of the bottom dielectric layer 102. The QNTs 106 are configured to trap charge that propagates through the QNT thin film. In some embodiments, the QNTs 106 may comprise nanocrystals made of a semiconductor material, such as, for example, silicon or gallium. In other embodiments, the QNTs 106 may comprise a different material, such as, for example, graphene. The QNTs 106 typically cover the top surface of the bottom dielectric layer 102 with a coverage ratio of the greater than or equal to about 20 percent. The coverage ratio is the ratio of the covered area of the top surface divided by the total area of the top surface. Further, the QNTs 106 extend from about even with the top surface of the bottom dielectric layer 102 into the top dielectric layer 104, and culminate at points in the top dielectric layer 104. The QNTs 106 typically have a pyramid shape or a cone shape. However, the QNTs 106 may have any other three dimensional shape with a width tapering from the bottom dielectric layer 102 into the top dielectric layer 104. In some embodiments, the QNTs 106 may have an aspect ratio of greater than or equal to about 50 percent. In other embodiments, the QNTs 106 may have an aspect ratio of greater than 50 percent. In yet other embodiments, the QNTs 106 may have an aspect ratio of greater than 70 percent. The aspect ratio is the ratio of height H to width W. As described above, the high curvature of the tips concentrates electric fields applied across the QNTs 106, which advantageously improves the efficiency of FNT.

Figure 2:
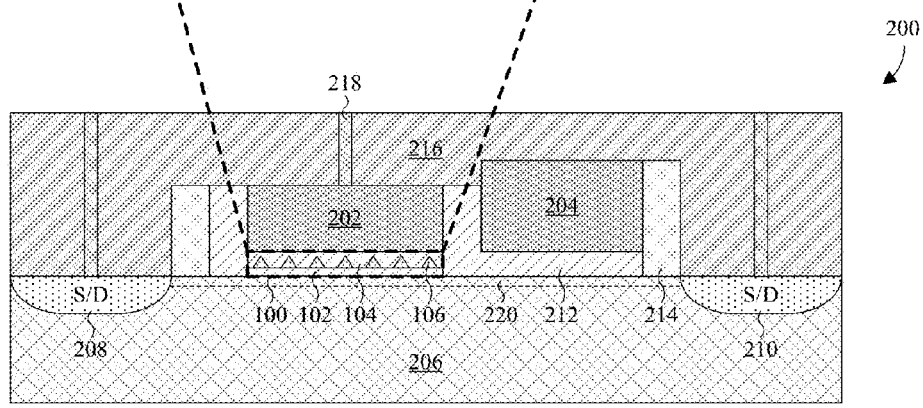
FIG. 2 illustrates a cross-sectional view of some embodiments of a split-gate flash memory cell with a QNT thin film.

With reference to FIG. 2, a cross-sectional view 200 of some embodiments of a split-gate flash memory cell is provided. A control gate 202 and a select gate 204 are spaced over a semiconductor substrate 206 between a pair of source/drain regions 208, 210 embedded in a top surface of the semiconductor substrate 206. The semiconductor substrate 206 may be, for example, a bulk semiconductor substrate, such as bulk silicon substrate, or a silicon-on-insulator (SOI) substrate. The control and select gates 202, 204 may be, for example, doped polysilicon or metal. The source/drain regions 208, 210 may be, for example, doped regions of the semiconductor substrate 206.

Underlying the control gate 202, a QNT thin film 100 spaces the control gate 202 from the semiconductor substrate 206. The QNT thin film 100 includes a bottom, tunneling dielectric layer 102, a top, blocking dielectric layer 104, and QNTs 106 arranged between the top and bottom dielectric layers 102, 104. The QNT thin film 100 stores a variable amount of charge representing a unit of data, such as a bit of data.

A spacer layer 212 underlies the select gate 204, and extends along sidewalls of the select and control gates 202, 204. The spacer layer 212 electrically isolates the select gate 204 from the semiconductor substrate 206 and from the control gate 202. Further, the spacer layer 212 spaces the select gate 204 from the control gate 202, and spaces the control gate 202 from a main sidewall layer 214 arranged around the select and control gates 202, 204. The spacer layer 212 may be, for example, silicon oxide or some other oxide. The main sidewall layer 214 may be, for example, silicon nitride or silicon oxide.

An interlayer dielectric (ILD) layer 216 is arranged over the semiconductor substrate 206 and the source/drain regions 208, 210, and over and around the main sidewall layer 214, the spacer layer 212 and the control and select gates 202, 204. Contacts 218 extend vertically through the ILD layer 216 to the control and/or select gates 202, 204, and/or to the source/drain regions 208, 210. The ILD layer 216 may be, for example, an oxide or a low κ dielectric (i.e., a dielectric with a dielectric constant less than 3.9).

During use of the split-gate flash memory cell 200, the variable amount of charge is toggled between a high charge state and a low charge state correspondingly by a program operation and an erase operation.

The program operation is typically performed using SSI. In accordance with SSI, a source/drain voltage is applied between the source/drain regions 208, 210 to generate a lateral electric field. Further, a select gate voltage is applied to the select gate 204, and a control gate program voltage is applied to the control gate 202. The control gate program voltage is high compared to the select gate voltage and the source/drain gate voltage. As such, an inversion channel region 220 of the semiconductor substrate 206 partially conducts under the select gate 204 and fully conducts under the control gate 202. Further, the lateral electric field concentrates in the inversion channel region 220 intermediate the select and control gates 202, 204 to form hot electrons. The high vertical electric field produced by the control gate program voltage then promotes the tunneling of the hot electrons towards the control gate 202. As the hot electrons tunnel, the hot electrons become trapped in the QNT thin film 100.

The erase operation is typically performed using FNT. In accordance with FNT, a zero voltage is applied to the source/drain regions 208, 210 and the select gate 204. Further, a control gate erase voltage is applied to the control gate 202. The control gate erase voltage creates a vertical electric field that promotes the tunneling of electrons trapped in the QNT thin film 100 toward the control gate 202. Due to the strength of the vertical electric field, the trapped electrons become dislodged from the QNT thin film 100 and tunnel to the control gate 202. Further, due to the high curvature of the QNTs 106 at the tips, the vertical electric field concentrates in the tips of the QNTs 106 proximate to the control gate 202. This increases the likelihood of the electrons tunneling to the control gate 202, and therefore the FNT efficiency. The improved FNT efficiency increases erase speed for a given control gate erase voltage or allows the control gate erase voltage to be reduced for a given erase speed. Reducing the control gate erase voltage reduces power consumption and/or the impact of the electric field on neighboring split-gate flash memory cells.

To determine whether the variable amount of charge stored in the QNT thin film 100 is in the high charge state or the low charge state, the resistance of the inversion channel region 220 is measured while the select gate voltage is applied to the select gate 204 and a control gate read voltage is applied to the control gate 202. Charge stored in the QNT thin film 100 screens (i.e., reduces) the vertical electric field produced in the inversion channel region 220 by the control gate 202. This, in turn, increases the threshold voltage $V_{th}$ of the control gate 202 by an amount $\Delta V_{th}$.

Therefore, the control gate read voltage is selected as being greater than $V_{th}$ and less than $V_{th}+\Delta V_{th}$. If current flows between the source/drain regions 208, 210, the QNT thin film 100 is in the low charge state. If current doesn't flow between the source/drain regions 208, 210, the QNT thin film 100 is in the high charge state.

Figure 3:
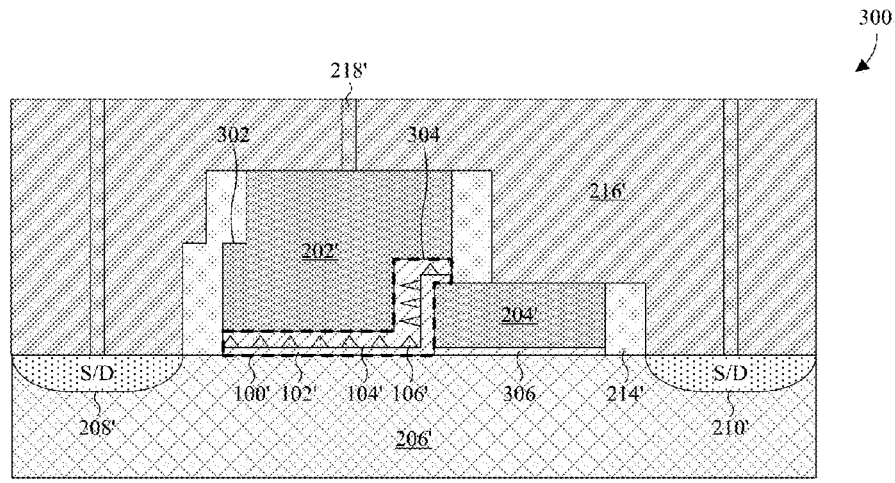
FIG. 3 illustrates a cross-sectional view of alternative embodiments of a split-gate flash memory cell with a QNT thin film.

With reference to FIG. 3, a cross-sectional 300 view of alternative embodiments of a split-gate flash memory cell is provided. A control gate 202' and a select gate 204' are spaced over a semiconductor substrate 206' between source/drain regions 208', 210' embedded in a top surface of the semiconductor substrate 206'. The control gate 202' includes a ledge 302 running along a side of the control gate 202' that is opposite the side neighboring the select gate 204'. Further, the control gate 202' includes an overhang 304 extending over the select gate 204'. A select gate dielectric layer 306 underlies the select gate 204' to electrically isolate the select gate 204' from the semiconductor substrate 206'. Further, a QNT thin film 100' underlies the control gate 202', and extends between neighboring surfaces of the control and select gates 202', 204' to a distal edge of the overhang 304. The QNT thin film 100' includes a bottom, tunneling dielectric layer 102', a top, blocking dielectric layer 104', and QNTs 106' arranged between the top and bottom dielectric layers 102', 104'.

A main sidewall layer 214' lines sidewalls of the select and control gates 202', 204'. Further, an ILD layer 216' is arranged over the semiconductor substrate 206' and the source/drain regions 208', 210', and over and around the main sidewall layer 214' and the control and select gates 202', 204'. Contacts 218' extend vertically through the ILD layer 216' to the control and/or select gates 202', 204', and/or to the source/drain regions 208', 210'.

Figure 4:
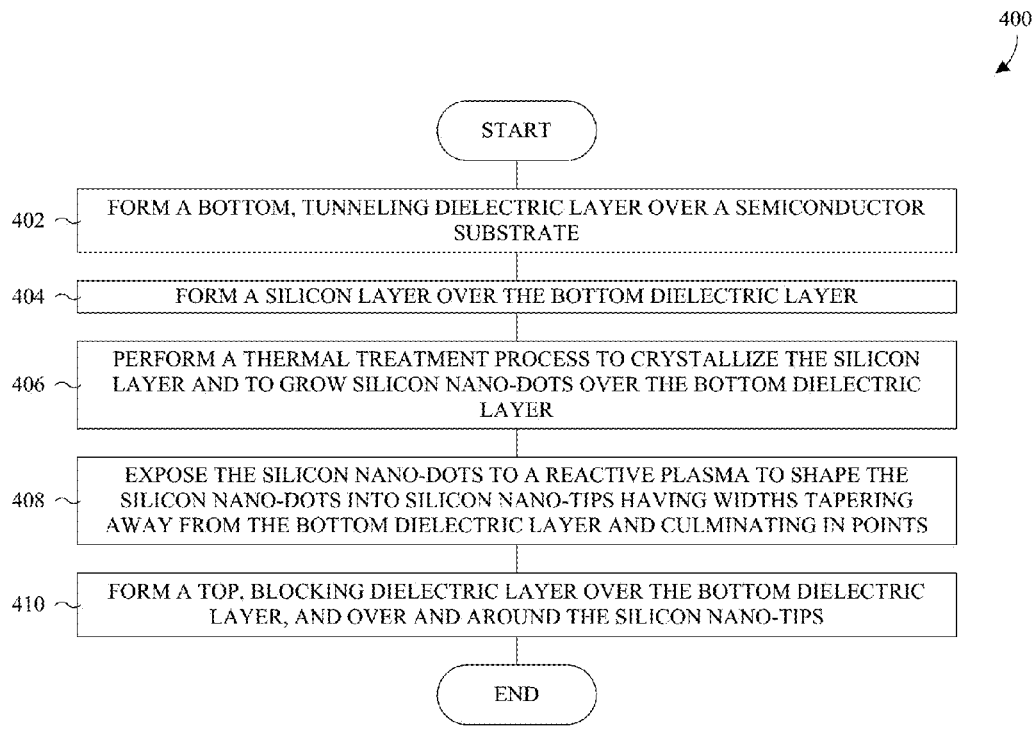
FIG. 4 illustrates a flowchart of some embodiments of a method for manufacturing a silicon nano-tip (SiNT) thin film.

With reference to FIG. 4, a flowchart 400 provides some embodiments of a method for manufacturing a SiNT thin film.

At 402, a bottom, tunneling dielectric layer is formed over a semiconductor substrate.

At 404, a silicon layer is formed over the bottom dielectric layer.

At 406, a thermal treatment process is performed to crystallize the silicon layer and to grow to grow SiNDs over the bottom dielectric layer.

At 408, the SiNDs are exposed to a reactive plasma to shape the SiNDs into SiNTs having widths tapering away from the bottom dielectric layer and culminating in points.

At 410, a top, blocking dielectric layer is formed over the bottom dielectric layer, and over and around the SiNTs.

While the method described by the flowchart 400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 5-8, cross-sectional views of some embodiments of a SiNT thin film at various stages of manufacture are provided to illustrate the method of FIG. 4. Although FIGS. 5-8 are described in relation to the method, it will be appreciated that the structures disclosed in FIGS. 5-8 are not limited to the method, but instead may stand alone as structures independent of the method. Similarly, although the method is described in relation to FIGS. 5-8, it will be appreciated that the method is not limited to the structures disclosed in FIGS. 5-8, but instead may stand alone independent of the structures disclosed in FIGS. 5-8.

Figure 5:
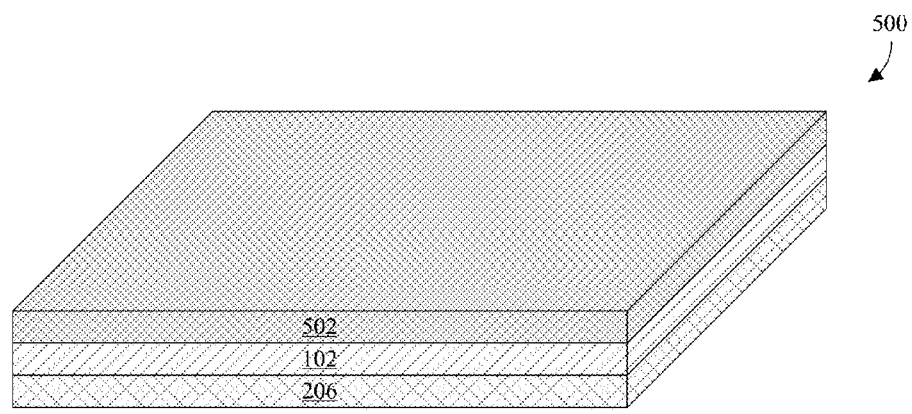
FIGS. 5-8 illustrate a series of perspective views of some embodiments of a SiNT thin film at various stages of manufacture.

FIG. 5 illustrates a cross-sectional view 500 of some embodiments corresponding to Acts 402 and 404. As illustrated, a semiconductor substrate 206 is provided. The semiconductor substrate 206 may be, for example, a bulk semiconductor substrate or an SOI substrate. Also illustrated, a bottom, tunneling dielectric layer 102 and a silicon layer 502 are formed stacked over the semiconductor substrate 206 in that order. The bottom dielectric layer 102 may be, for example, silicon dioxide, and/or may have, for example, a thickness of less than about 100 Angstroms. The silicon layer 502 may have, for example, a thickness less than the bottom dielectric layer 102.

Figure 6:
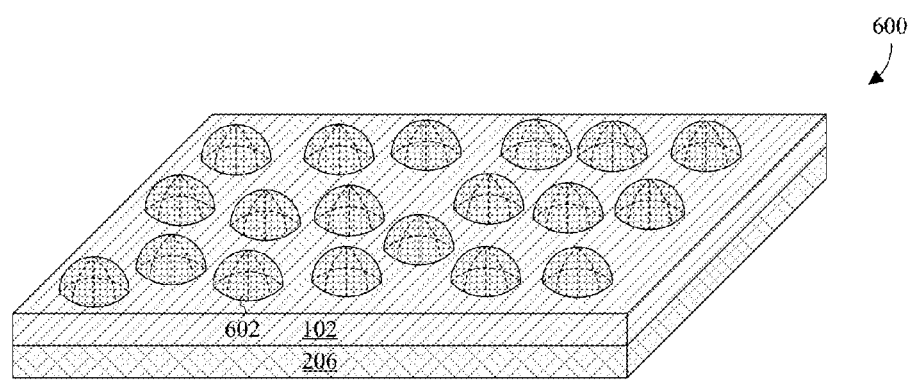

FIG. 6 illustrates a cross-sectional view 600 of some embodiments corresponding to Act 406. As illustrated, a thermal treatment process is performed to crytallize the silicon layer 502 and to grow SiNDs 602 over the bottom dielectric layer 102. The SiNDs 602 typically have a semi-spherical shape with radiuses of about 10-100 Angstroms. However, other shapes and/or sizes are amenable. Further, the SiNDs 602 typically cover the bottom dielectric layer 102 with a coverage ratio of greater than or equal to about 20 percent. In alternative embodiments, the SiNDs 602 are formed by chemical vapor deposition (CVD) or other known techniques for forming SiNDs.

Figure 7:
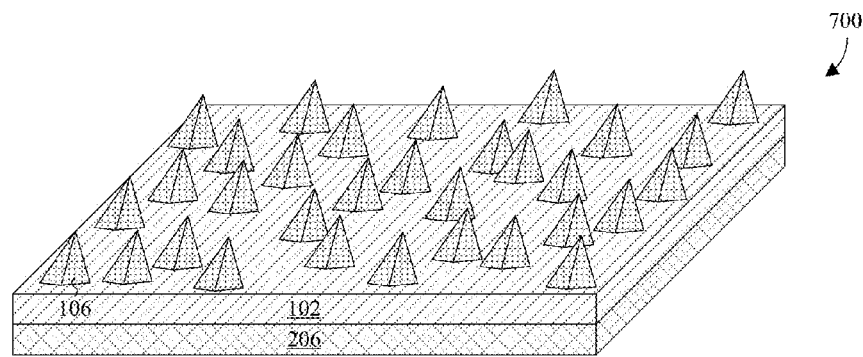

FIG. 7 illustrates a cross-sectional view 700 of some embodiments corresponding to Act 408. As illustrated, the SiNDs 602 are exposed to a reactive plasma to shape the SiNDs 602 into SiNTs 106 having widths tapering away from the bottom dielectric layer 102 and culminating in points. The SiNDs 602 may be exposed to the reactive plasma by a radio frequency (RF) plasma reactor. The reactive plasma may include or consist essentially of, for example, argon and hydrogen. In such embodiments, the ratio of hydrogen and argon, and/or the temperature the reactive plasma, are controlled to shape the SiNDs 602. The SiNTs 106 typically have aspect ratios of greater than or equal to about 50%.

Figure 8:
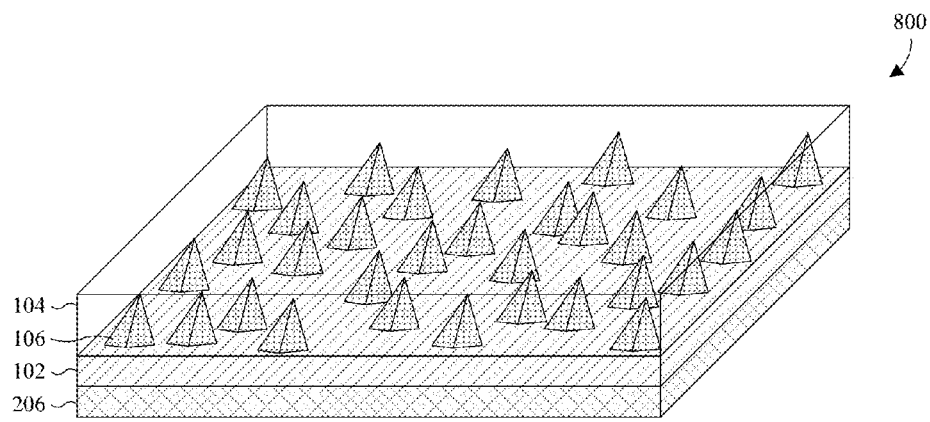

FIG. 8 illustrates a cross-sectional view 800 of some embodiments corresponding to Act 410. As illustrated, a top, blocking dielectric layer 104 is formed over the bottom dielectric layer 102, and over and around the SiNTs 106. The top dielectric layer 104 may be formed, for example, with a thickness greater than the first dielectric layer 102, but less than about 200 Angstroms. Further, the top dielectric layer 104 may be, for example, formed using any suitable deposition technique, such as CVD, and/or of an oxide, such as silicon dioxide.

Figure 9:
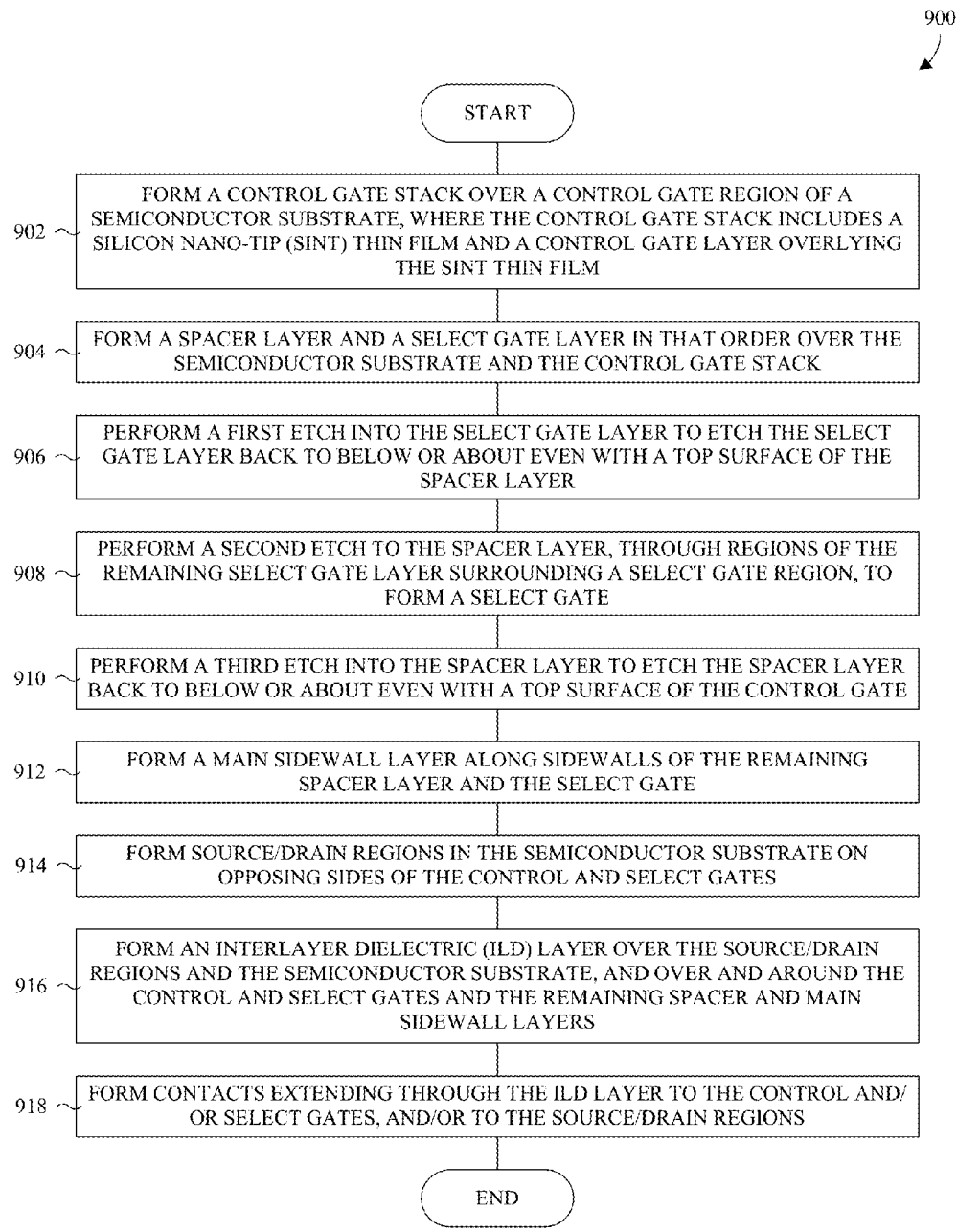
FIG. 9 illustrates a flow chart of some embodiments of a method for manufacturing a SiNT based split-gate flash memory cell.

With reference to FIG. 9, a flowchart 900 provides some embodiments of a method for manufacturing a SiNT based split-gate flash memory cell.

At 902, a control gate stack is formed over a control gate region of a semiconductor substrate. The control gate stack includes a SiNT thin film and a control gate layer overlying the SiNT thin film.

At 904, a spacer layer and a select gate layer are sequentially formed in that order over the semiconductor substrate and the control gate stack.

At 906, a first etch is performed into the select gate layer to etch the select gate layer back to below or about even with a top surface of the spacer layer.

At 908, a second etch is performed to the spacer layer, through regions of the remaining select gate layer surrounding a select gate region, to form a select gate.

At 910, a third etch is performed into the spacer layer to etch the spacer layer back to below or about even with a top surface of the control gate.

At 912, a main sidewall layer is formed along sidewalls of the remaining spacer layer and the select gate.

At 914, source/drain regions are formed in the semiconductor substrate on opposing sides of the control and select gates.

At 916, an ILD layer is formed over the source/drain regions and the semiconductor substrate, and over and around the control and select gates and the remaining spacer and main sidewall layers.

At 918, contacts are formed extending through the ILD layer to the control and/or select gates, and/or to the source/drain regions.

While the method described by the flowchart 900 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 10-20, cross-sectional views of some embodiments of a SiNT based split-gate flash memory cell at various stages of manufacture are provided to illustrate the method of FIG. 9. Although FIGS. 10-20 are described in relation to the method, it will be appreciated that the structures disclosed in FIGS. 10-20 are not limited to the method, but instead may stand alone as structures independent of the method. Similarly, although the method is described in relation to FIGS. 10-20, it will be appreciated that the method is not limited to the structures disclosed in FIGS. 10-20, but instead may stand alone independent of the structures disclosed in FIGS. 10-20.

Figure 10:
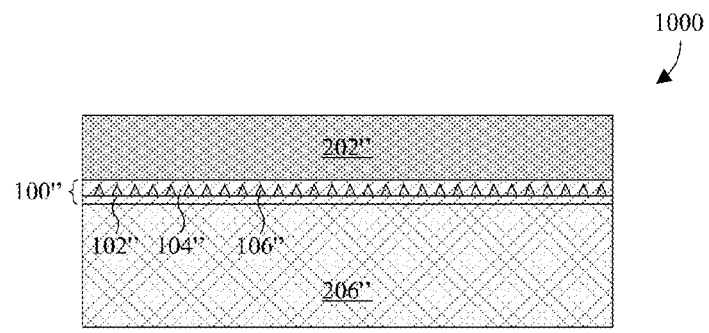
FIGS. 10-20 illustrate a series of cross-sectional views of some embodiments of a SiNT based split-gate flash memory cell at various stages of manufacture.
Figure 11:
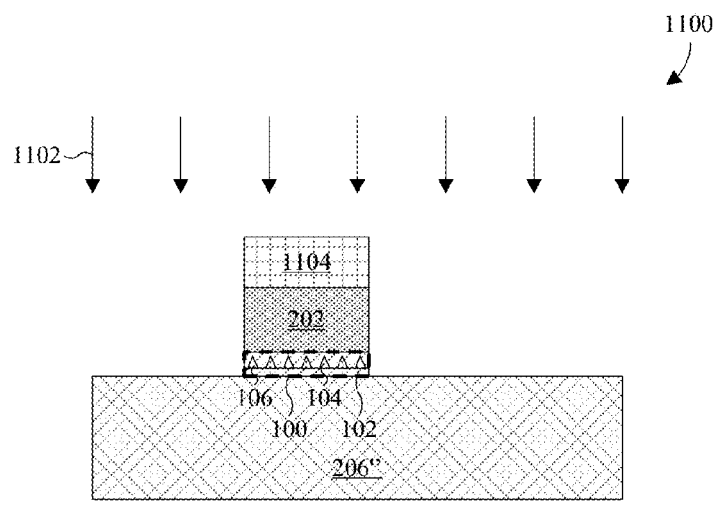

FIGS. 10 and 11 illustrate cross-sectional views 1000, 1100 of some embodiments corresponding to Act 902.

As illustrated by FIG. 10, a semiconductor substrate 206" is provided. The semiconductor substrate 206" may be, for example, a bulk semiconductor substrate or an SOI substrate. Also illustrated, a SiNT thin film 100" and a control gate layer 202" are stacked over the semiconductor substrate 206" in that order. The SiNT thin film 100" includes a bottom, tunneling dielectric layer 102", a top, blocking dielectric layer 104" arranged over the bottom dielectric layer 102", and SiNTs 106" arranged between the top and bottom dielectric layers 102", 104". The SiNT thin film 100" may be, for example, formed as described in FIG. 4. Further, the control gate layer 202" may be, for example, formed using any suitable deposition technique, such as physical vapor deposition (PVD). The control gate layer 202" may be, for example, a conductive material, such as metal or doped polysilicon.

As illustrated by FIG. 11, a first etch is performed to the semiconductor substrate 206" through regions of the control gate layer 202" and the SiNT thin film 100" surrounding a control gate region. The first etch results in a control gate stack having a control gate 202 overlying the remaining SiNT thin film 100. In some embodiments, the process for performing the first etch includes: forming a photoresist layer over the control gate layer 202"; patterning the photoresist layer to mask the control gate region; applying an etchant 1102 to the control gate layer 202" and the SiNT thin film 100"; and removing the patterned photoresist layer 1104.

Figure 12:
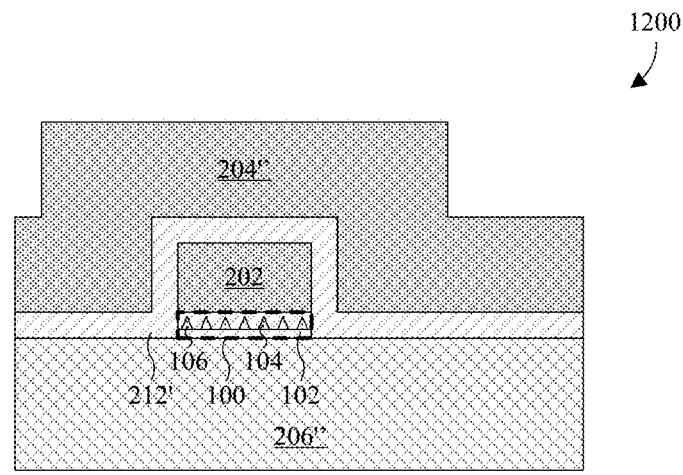

FIG. 12 illustrates a cross-sectional view 1200 of some embodiments corresponding to Act 904.

As illustrated by FIG. 12, a spacer layer 212' and a select gate layer 204" are formed in that order. The spacer layer 212' is formed over the semiconductor substrate 206", and lining the remaining SiNT thin film 100 and the control gate 202. The select gate layer 204" is formed lining the spacer layer 212'. Typically, the spacing and select gate layers 204", 212' are formed using a conformal deposition technique. The select gate layer 204" may be, for example, a conductive material, such as metal or doped polysilicon. The spacer layer 212' may be, for example, a dielectric, such as silicon dioxide.

Figure 13:
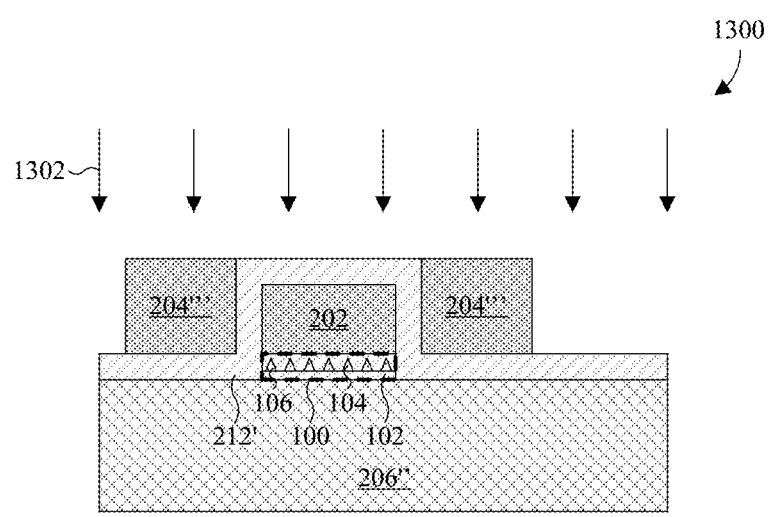

FIG. 13 illustrates a cross-sectional view 1300 of some embodiments corresponding to Act 906.

As illustrated by FIG. 13, a second etch is performed into the select gate layer 204" to etch the select gate layer 204" back to below or about even with a top surface of the spacer layer 212'. The second etch also removes lateral stretches of the select gate layer 204". In some embodiments, the second etch is performed by exposing the select gate layer 204" to an etchant 1302 for the approximate time it takes the etchant 1302 to etch through the thickness of the select gate layer 204".

Figure 14:
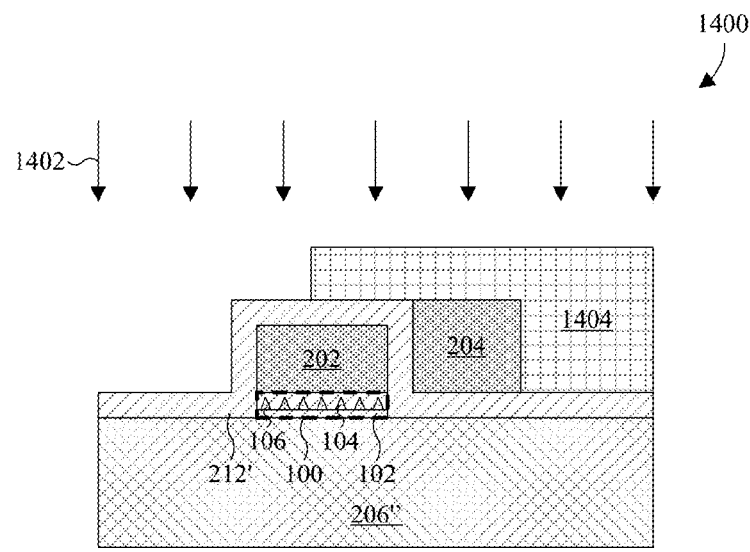

FIG. 14 illustrates a cross-sectional view 1400 of some embodiments corresponding to Act 908.

As illustrated by FIG. 14, a third etch is performed to the spacer layer 212', through regions of the remaining select gate layer 204''' surrounding a select gate region, to form a select gate 204. In some embodiments, the process for performing the third etch includes: forming a photoresist layer over the remaining select gate layer 204''' and the spacer layer 212'; patterning the photoresist layer to mask the select gate region; applying an etchant 1402 to the remaining select gate layer 204'''; and removing the patterned photoresist layer 1404.

Figure 15:
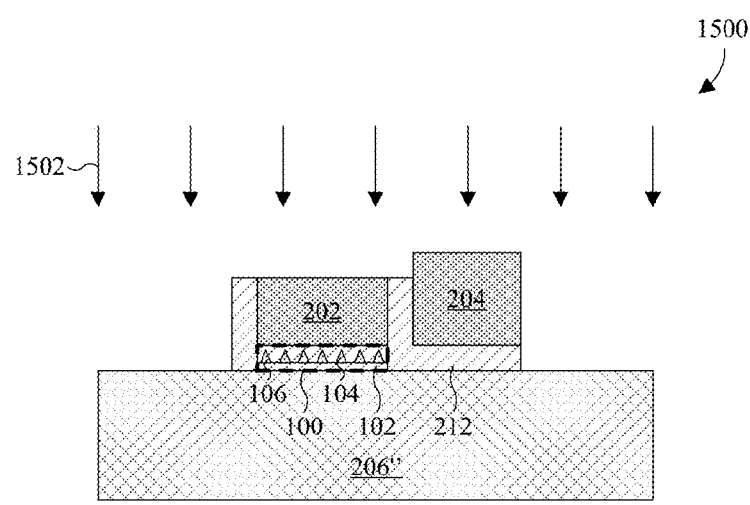

FIG. 15 illustrates a cross-sectional view 1500 of some embodiments corresponding to Act 910.

As illustrated by FIG. 15, a fourth etch is performed into the spacer layer 212' to etch the spacer layer 212' back to below or about even with a top surface of the control gate 202. The fourth etch also removes lateral stretches of the spacer layer 212'. In some embodiments, the fourth etch is performed by exposing the spacer layer 212' to an etchant 1502 for the approximate time it takes the etchant 1502 to etch through the thickness of the spacer layer 212'.

Figure 16:
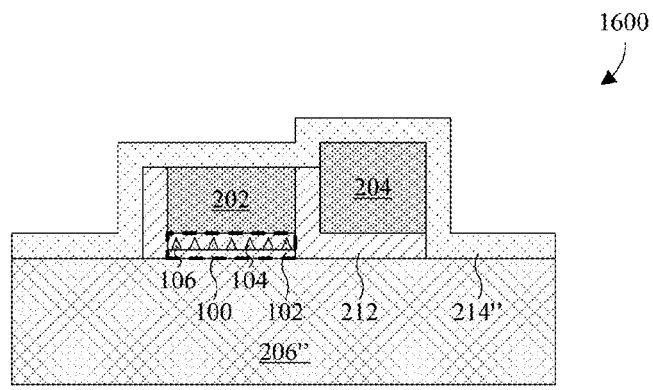
Figure 17:
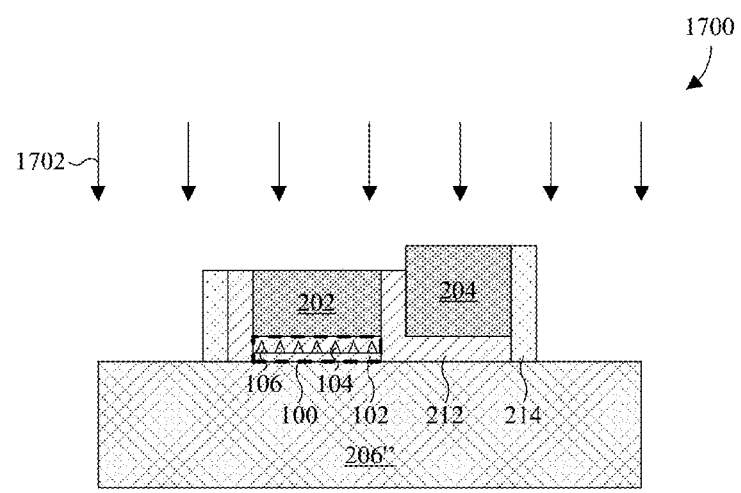

FIGS. 16 and 17 illustrate cross-sectional views 1600, 1700 of some embodiments corresponding to Act 912.

As illustrated by FIG. 16, a main sidewall layer 214" is formed over the semiconductor substrate 206", and lining the remaining spacer layer 212 and the control and select gates 202, 204. Typically, the main sidewall layer 214" is formed using a conformal deposition technique. The main sidewall layer 214" may be, for example, a dielectric, such as silicon nitride.

As illustrated by FIG. 17, a fifth etch is performed into the main sidewall layer 214" to etch the main sidewall layer 214" back below or about even with a top surface of the select gate 204. The fifth etch also removes lateral stretches of the main sidewall layer 214". In some embodiments, the fifth etch is performed by exposing the main sidewall layer 214" to an etchant 1702 for the approximate time it takes the etchant 1702 to etch through the thickness of the main sidewall layer 214".

Figure 18:
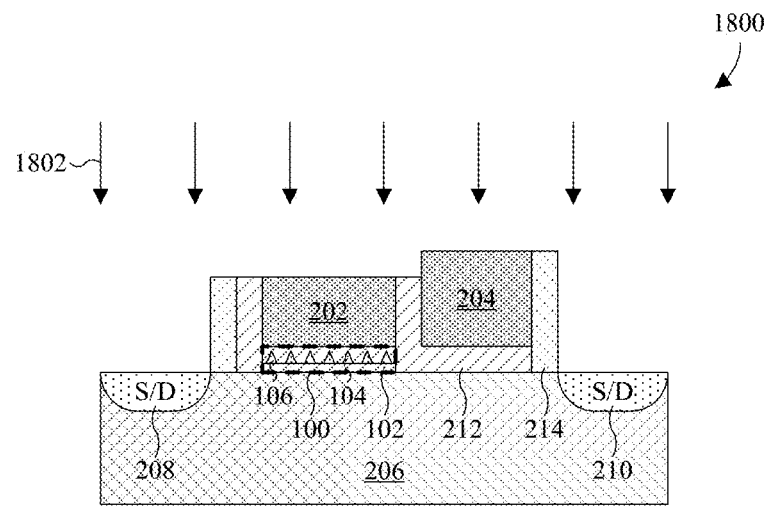

FIG. 18 illustrates a cross-sectional view 1800 of some embodiments corresponding to Act 914.

As illustrated by FIG. 18, source/drain regions 208, 210 are formed on opposing sides of the select and control gates 202, 204. The source/drain regions 208, 210 correspond to doped regions of the semiconductor substrate 206". In some embodiments, the process for forming the source/drain regions 208, 210 includes implanting ions 1802 in the semiconductor substrate 206", with or without a mask masking the remaining main sidewall and spacer layers 212, 214 and the control and select gates 202, 204.

Figure 19:
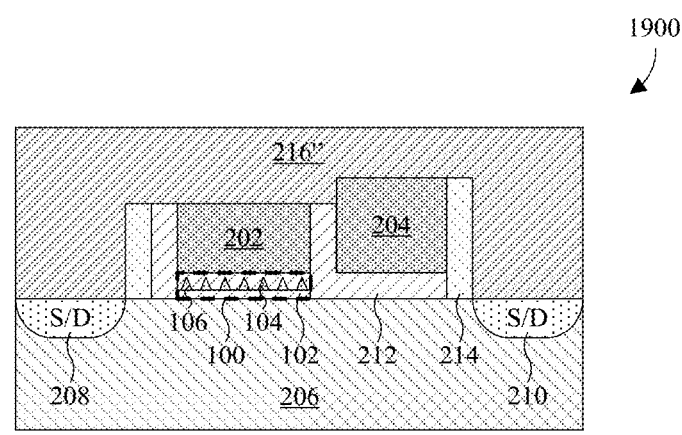

FIG. 19 illustrates a cross-sectional view 1900 of some embodiments corresponding to Act 916.

As illustrated by FIG. 19, an ILD layer 216" is formed over the source/drain regions 208, 210 and the semiconductor substrate 206, and over and around the control and select gates 202, 204 and the remaining spacer and sidewall layers 212, 214. The ILD layer 216" maybe formed using any suitable deposition technique and may be, for example, a low κ dielectric. In some embodiments, the process for forming the ILD layer 216" includes forming an intermediate ILD layer and performing a chemical mechanical polish (CMP) into the intermediate ILD layer.

Figure 20:
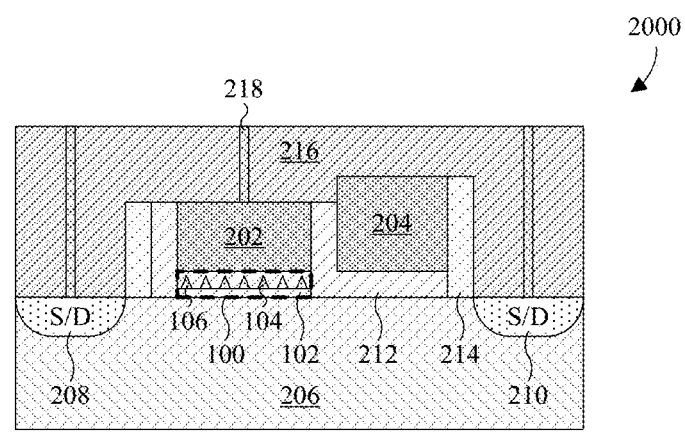

FIG. 20 illustrates a cross-sectional view 200 of some embodiments corresponding to Act 918.

As illustrated by FIG. 20, contacts 218 are formed extending through the ILD layer 216" to the control and/or select gates 202, 204, and/or to the source/drain regions 208, 210. The contacts 218 may be, for example, a metal, such as copper or tungsten. In some embodiments, the process for forming the contacts 218 includes: forming contact openings using an etching process; filling the contact openings with a conductive material; and performing a CMP to the ILD layer 216" through the conductive material.

Figure 21:
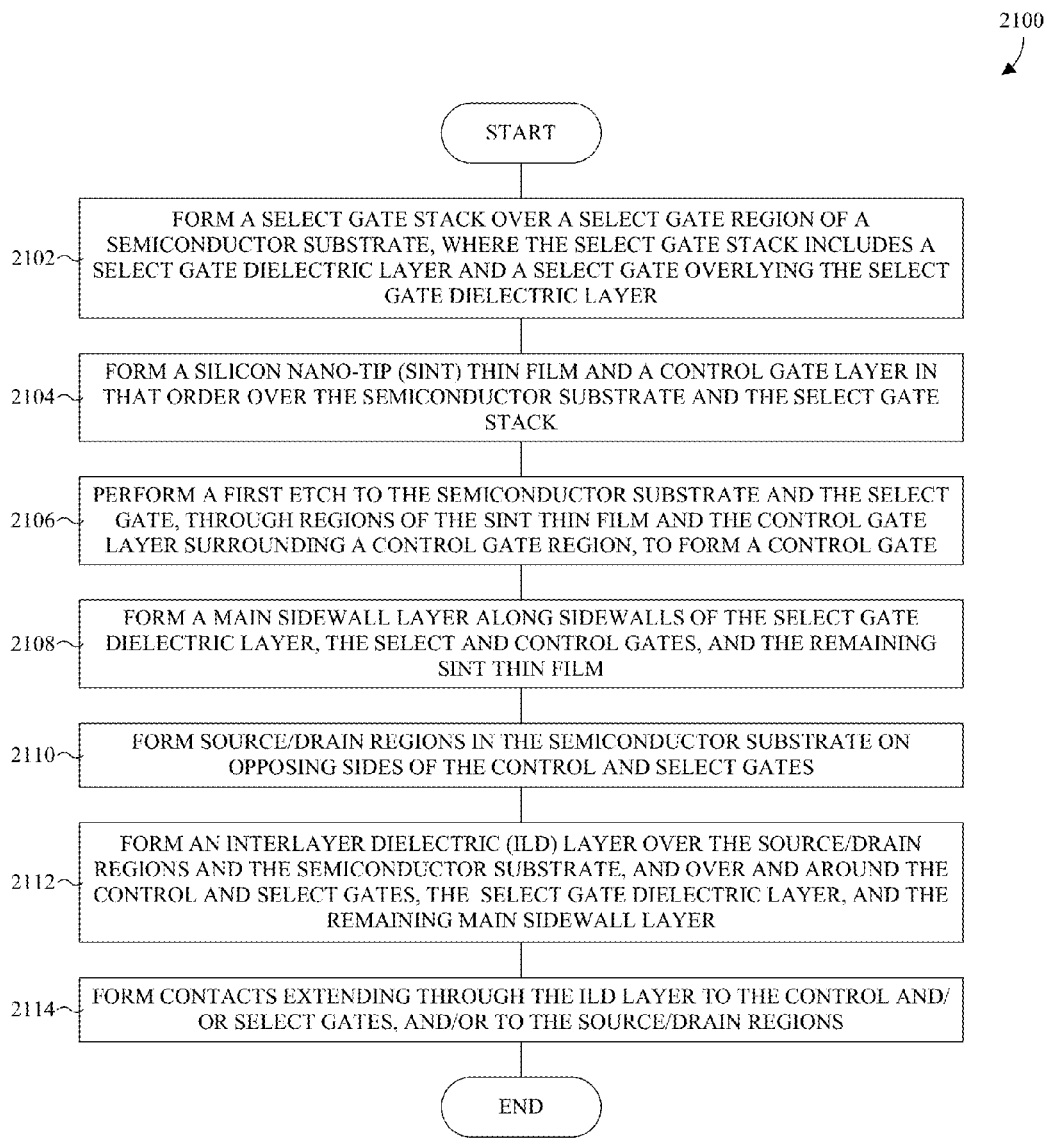
FIG. 21 illustrates a flow chart of alternative embodiments of a method for manufacturing a SiNT based split-gate flash memory cell.

With reference to FIG. 21, a flowchart 2100 provides alternative embodiments of a method for manufacturing a SiNT based split-gate flash memory cell.

At 2102, a select gate stack is formed over a select gate region of a semiconductor substrate. The select gate stack includes a select gate dielectric layer and a select gate overlying the select gate dielectric layer.

At 2104, a SiNT thin film and a control gate layer are formed in that order over the semiconductor substrate and the select gate stack.

At 2106, a first etch is performed to the semiconductor substrate and the select gate, through regions of the SiNT thin film and the control gate layer surrounding a control gate region, to form a control gate.

At 2108, a main sidewall layer is formed along sidewalls of the select gate dielectric layer, the select and control gates, and the remaining SiNT thin film.

At 2110, source/drain regions are formed in the semiconductor substrate on opposing sides of the select and control gates.

At 2112, an ILD layer is formed over the source/drain regions and the semiconductor substrate. Further, the ILD layer is formed over and around the control and select gates, the select gate dielectric layer, and the remaining main sidewall layer.

At 2114, contacts are formed extending through the ILD layer to the control and/or select gates, and/or to the source/drain regions.

While the method described by the flowchart 2100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 22-30, cross-sectional views of alternative embodiments of a SiNT based split-gate flash memory cell at various stages of manufacture are provided to illustrate the method of FIG. 21. Although FIGS. 22-30 are described in relation to the method, it will be appreciated that the structures disclosed in FIGS. 22-30 are not limited to the method, but instead may stand alone as structures independent of the method. Similarly, although the method is described in relation to FIGS. 22-30, it will be appreciated that the method is not limited to the structures disclosed in FIGS. 22-30, but instead may stand alone independent of the structures disclosed in FIGS. 22-30.

Figure 22:
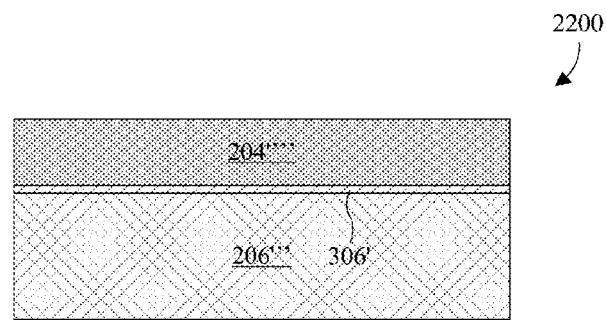
FIGS. 22-30 illustrate a series of cross-sectional views of alternative embodiments of a SiNT based split-gate flash memory cell at various stages of manufacture.
Figure 23:
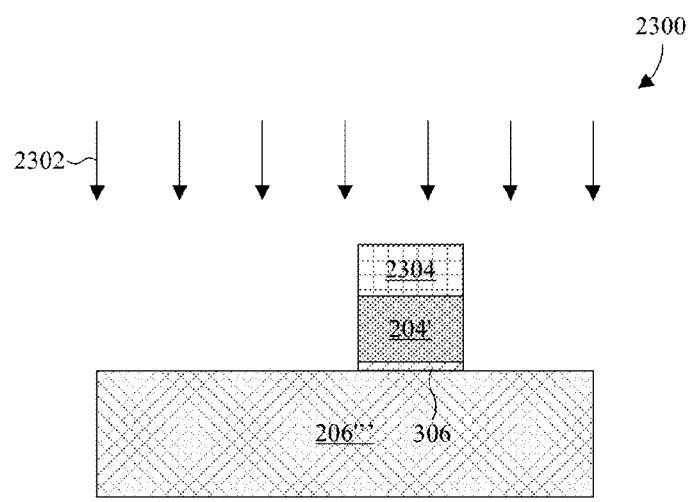

FIGS. 22 and 23 illustrate cross-sectional views 2200, 2300 of some embodiments corresponding to Act 2102.

As illustrated by FIG. 22, a semiconductor substrate 206''' is provided. The semiconductor substrate 206''' may be, for example, a bulk semiconductor substrate or an SOI substrate. Also illustrated, a select gate dielectric layer 306' and a select gate layer 204'''' are stacked in that order over the semiconductor substrate 206'''. The select gate dielectric layer 306' may be, for example, silicon dioxide. Further, the select gate layer 204'' may be, for example, a conductive material, such as metal or doped polysilicon.

As illustrated by FIG. 23, a first etch is performed to the semiconductor substrate 206''' through regions of the select gate layer 204'''' and the select gate dielectric layer 306' surrounding a select gate region. The first etch results in a select gate stack having a select gate 204' overlying the remaining select gate dielectric layer 306. In some embodiments, the process for performing the first etch includes: forming a photoresist layer over the select gate layer 204''''; patterning the photoresist layer to mask the select gate region; applying an etchant 2302 to the select gate layer 204'''' and the select gate dielectric layer 306'; and removing the patterned photoresist layer 2304.

Figure 24:
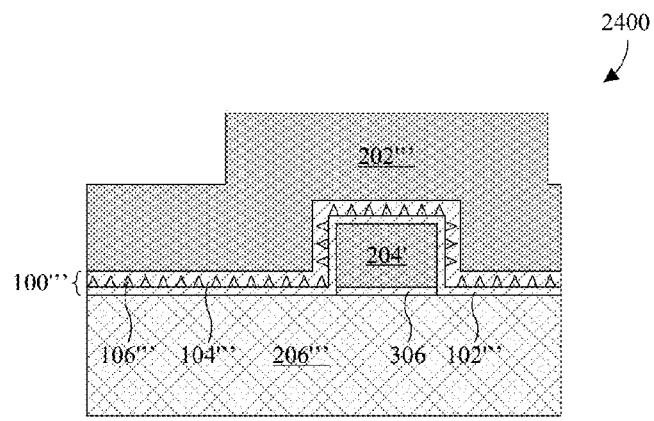

FIG. 24 illustrates a cross-sectional view 2400 of some embodiments corresponding to Act 2104.

As illustrated by FIG. 24, SiNT thin film 100''' and a control gate layer 202''' are formed in that order. The SiNT thin film 100''' is formed over the semiconductor substrate 206''', and lining the remaining select gate dielectric layer 306 and the select gate 204'. The SiNT thin film 100''' includes a bottom, tunneling dielectric layer 102''', a top, blocking dielectric layer 104''' arranged over the bottom dielectric layer 102''', and SiNTs 106''' arranged between the top and bottom dielectric layers 102''', 104'''. The SiNT thin film 100''' is typically formed conformally and as described in FIG. 4. The control gate layer 202''' is formed lining the SiNT thin film 100''', typically conformally. The control gate layer 202''' may be, for example, a conductive material, such as metal or doped polysilicon.

Figure 25:
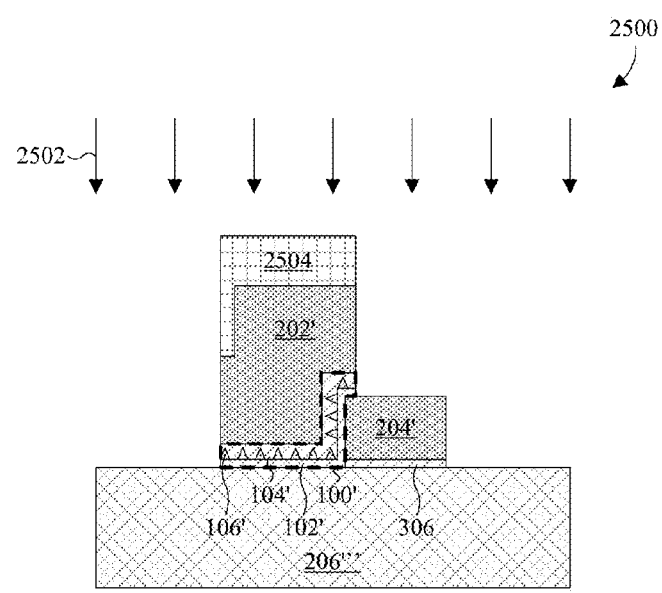

FIG. 25 illustrates a cross-sectional view 2500 of some embodiments corresponding to Act 2106.

As illustrated by FIG. 25, a second etch is performed to the semiconductor substrate 206''' and the select gate 204', through regions of the SiNT thin film 100''' and the control gate layer 202''' surrounding a control gate region. The second etch results in a control gate 202' overlying the remaining SiNT thin film 100'. In some embodiments, the process for performing the second etch includes: forming a photoresist layer over the control gate layer 202''' and the SiNT thin film 100'''; patterning the photoresist layer to mask the control gate region; applying an etchant 2502 to the control gate layer 202''' and the SiNT thin film 100'''; and removing the patterned photoresist layer 2504.

Figure 26:
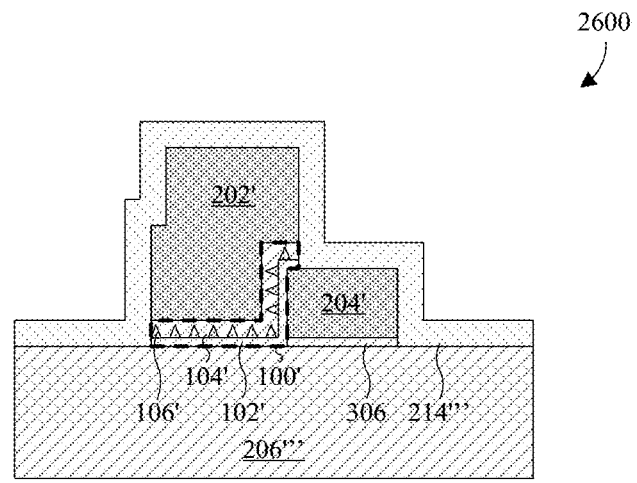
Figure 27:
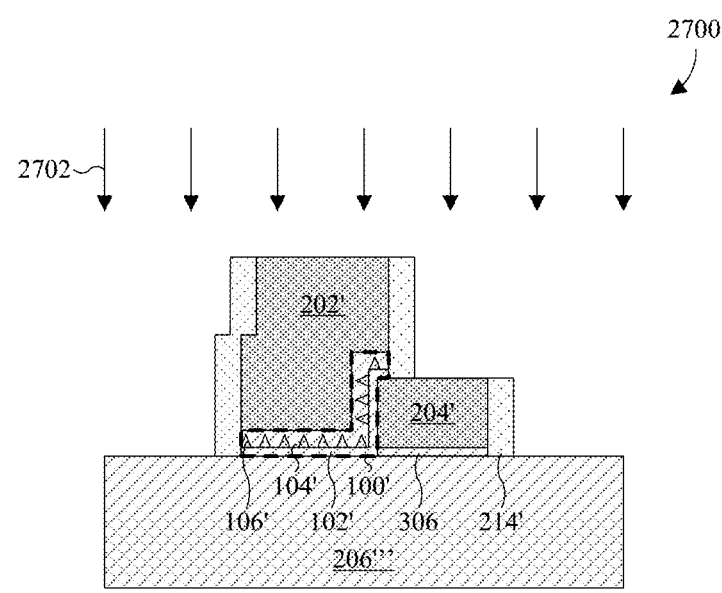

FIGS. 26 and 27 illustrate cross-sectional views 2600, 2700 of some embodiments corresponding to Act 2108.

As illustrated by FIG. 26, a main sidewall layer 214''' is formed over the semiconductor substrate 206''', and lining the remaining select gate dielectric layer 306, the remaining SiNT thin film 100', and the control and select gates 202', 204'. Typically, the main sidewall layer 214''' is formed using a conformal deposition technique. The main sidewall layer 214''' may be, for example, silicon nitride.

As illustrated by FIG. 27, a third etch is performed into the main sidewall layer 214''' to etch the main sidewall layer 214''' back below or about even with a top surface of the control gate 202'. The third etch also removes lateral stretches of the main sidewall layer 214'''. In some embodiments, the third etch is performed by exposing the main sidewall layer 214''' to an etchant 2702 for the approximate time it takes the etchant 2702 to etch through the thickness of the main sidewall layer 214'.

Figure 28:
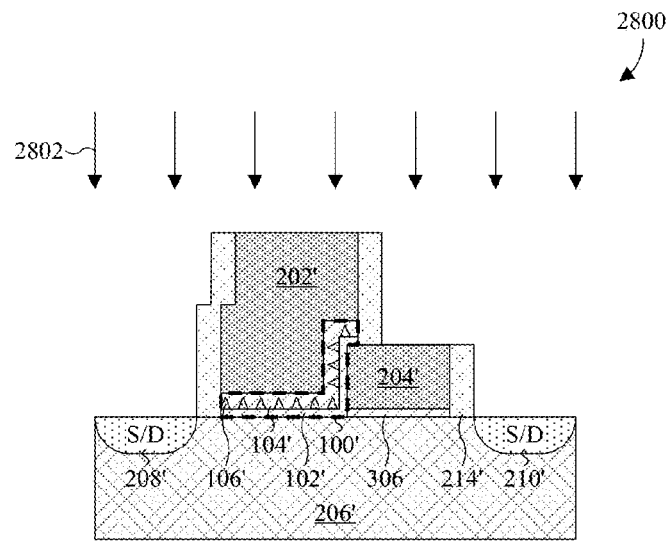

FIG. 28 illustrates a cross-sectional view 2800 of some embodiments corresponding to Act 2110.

As illustrated by FIG. 28, source/drain regions 208', 210' are formed on opposing sides of the select and control gates 202', 204'. The source/drain regions 208', 210' correspond to doped regions of the semiconductor substrate 206''. In some embodiments, the process for forming the source/drain regions 208', 210' includes implanting ions 2802 in the semiconductor substrate 206''', with or without a mask masking the remaining main sidewall and select gate dielectric layers 214', 306 and the control and select gates 202', 204'.

Figure 29:
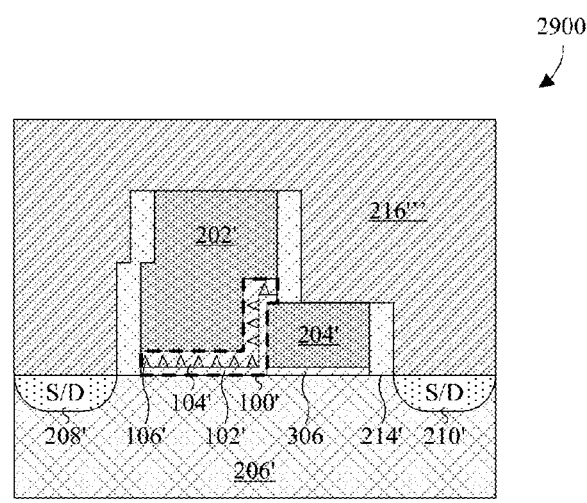

FIG. 29 illustrates a cross-sectional view 2900 of some embodiments corresponding to Act 2112.

As illustrated by FIG. 29, an ILD layer 216''' is formed over the source/drain regions 208', 210' and the semiconductor substrate 206', and over and around the control and select gates 202', 204' and the remaining main sidewall and select gate dielectric layers 214', 306. The ILD layer 216''' maybe formed using any suitable deposition technique and may be, for example, a low κ dielectric. In some embodiments, the process for forming the ILD layer 216''' includes forming an intermediate ILD layer and performing a CMP into the intermediate ILD layer.

Figure 30:
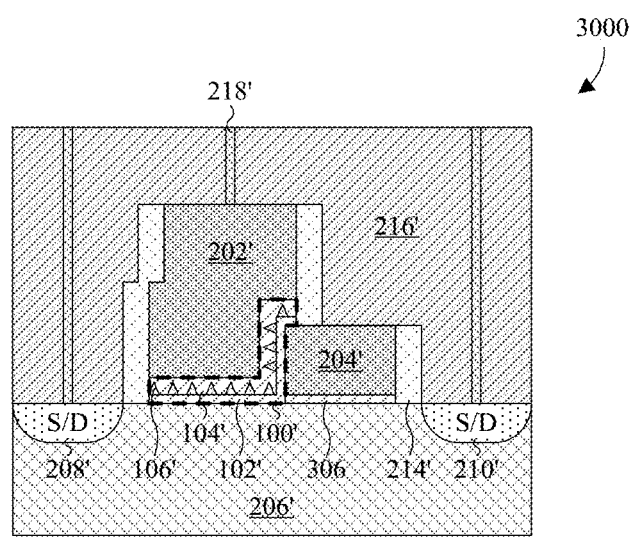

FIG. 30 illustrates a cross-sectional view 3000 of some embodiments corresponding to Act 2114.

As illustrated by FIG. 30, contacts 218' are formed extending through the ILD layer 216''' to the control and/or select gates 202', 204', and/or to the source/drain regions 208', 210'. The contacts 218' may be, for example, a metal, such as copper or tungsten. In some embodiments, the process for forming the contacts 218' includes: forming contact openings using an etching process; filling the contact openings with a conductive material; and performing a CMP to the ILD layer 216' through the conductive material.

Thus, as can be appreciated from above, the present disclosure provides a flash memory cell. The flash memory cell includes a semiconductor substrate and a quantum nano-tip thin film. The quantum nano-tip thin film is configured to trap charges corresponding to a unit of data. Further, the quantum nano-tip thin film includes a first dielectric layer arranged over the semiconductor substrate, a second dielectric layer arranged over the first dielectric layer, and quantum nano-tips arranged over the first dielectric layer and extending into the second dielectric layer. The quantum nano-tips culminate at points within the second dielectric layer.

In other embodiments, the present disclosure provides a method for manufacturing a flash memory cell. A first dielectric layer is formed over a semiconductor substrate. A silicon layer is formed over the first dielectric layer. A thermal treatment process is performed to crystallize the silicon layer and to grow SiNDs over the first dielectric layer. The SiNDs are exposed to a reactive plasma to shape the SiNDs into SiNTs having widths tapering away from the first dielectric layer and culminating in points. A second dielectric layer is formed over the first dielectric layer and the SiNTs.

In yet other embodiments, the present disclosure provides a storage film for a flash memory cell. The storage film includes a first dielectric layer, a second dielectric layer arranged over the first dielectric layer, and SiNTs arranged over the first dielectric layer and extending into the second dielectric layer. A ratio of height to width of the SiNTs is greater than 50 percent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flash memory cell comprising:
a semiconductor substrate;
a pair of source/drain regions embedded in a top surface of the semiconductor substrate;
a quantum nano-tip thin film configured to trap charges corresponding to a unit of data, wherein the quantum nano-tip thin film includes:
a first dielectric layer arranged over the semiconductor substrate;
a second dielectric layer arranged over the first dielectric layer; and
quantum nano-tips arranged over the first dielectric layer and extending into the second dielectric layer, wherein the quantum nano-tips culminate at points within the second dielectric layer and have a cone shape;
a control gate arranged over the quantum nano-tip thin film between the source/drain regions of the pair;
a select gate laterally spaced between the control gate and one of the source/drain regions of the pair; and
a spacer layer arranged under the select gate, and extending between neighboring sidewalls of the control and select gates, wherein a top surface of the spacer layer is aligned to a top surface of the control gate, wherein the spacer layer comprises a pair of segments arranged respectively on opposite sides of the control gate, wherein the segments comprise a segment extending continuously from under the select gate, between the neighboring sidewalls of the control and select gates, to the top surface of the spacer layer, and wherein the top surfaces of the spacer layer and the control gate are recessed below a top surface of the select gate.

2. The flash memory cell according to claim 1, wherein the quantum nano-tips have a ratio of height to width that is greater than or equal to about 50 percent.

3. The flash memory cell according to claim 1, wherein the first and second dielectric layers include an oxide, and wherein the quantum nano-tips include silicon.

4. The flash memory cell according to claim 1, wherein a thickness of the first dielectric layer is less than about 100 Angstroms, and wherein a thickness of the second dielectric layer is less than about 200 Angstroms.

5. A memory cell comprising:
a control gate arranged on a semiconductor substrate, laterally between a first source/drain region and a second source/drain region, wherein the first and second source/drain regions are embedded in the semiconductor substrate;
a storage film arranged under the control gate, between the semiconductor substrate and the control gate, wherein the storage film comprises a first dielectric layer and a second dielectric layer arranged over the first dielectric layer, wherein the storage film further comprises quantum nano-tips arranged between the first and second dielectric layers, and wherein the quantum nano-tips protrude towards the second dielectric layer and culminate in points;
a select gate arranged laterally adjacent to the control gate;
a spacer layer extending laterally under the select gate and vertically between neighboring sidewall surfaces of the select and control gates, wherein a top surface of the spacer layer is aligned to a top surface of the control gate, wherein the spacer layer comprises a pair of segments respectively arranged on opposite sides of the control gate, and wherein the segments comprise an L-shaped segment arranged under the select gate and between the neighboring sidewall surfaces of the select and control gates; and
a sidewall layer comprising a first segment adjoining a sidewall of the select gate and a first sidewall of the spacer layer, and further comprising a second segment adjoining a second sidewall of the spacer layer, wherein the control and select gates are arranged laterally between the first and second segments of the sidewall layer.

6. The memory cell according to claim 5, wherein the quantum nano-tips have a cone shape.

7. The memory cell according to claim 5, wherein a height of the quantum nano-tips is greater than a half of a width of the quantum nano-tips.

8. The flash memory cell according to claim 1, wherein the quantum nano-tips have individual bottom surfaces.

9. The flash memory cell according to claim 1, wherein the second dielectric layer directly contacts the control gate.

10. A flash memory cell comprising:
a semiconductor substrate;
a pair of source/drain regions embedded in a top surface of the semiconductor substrate;
a quantum nano-tip thin film configured to trap charges corresponding to a unit of data, wherein the quantum nano-tip thin film includes:
a first dielectric layer arranged over the semiconductor substrate;
a second dielectric layer arranged over the first dielectric layer; and
quantum nano-tips arranged over the first dielectric layer and extending into the second dielectric layer, wherein the quantum nano-tips culminate at points within the second dielectric layer and have a cone shape;
a control gate arranged over the quantum nano-tip thin film between the source/drain regions of the pair;
a select gate laterally spaced between the control gate and one of the source/drain regions of the pair;
a spacer layer arranged under the select gate, and extending between neighboring sidewalls of the control and select gates, wherein a top surface of the spacer layer is aligned to a top surface of the control gate, wherein the spacer layer comprises a pair of segments arranged respectively on opposite sides of the control gate, wherein the segments comprise a segment extending continuously from under the select gate, between the neighboring sidewalls of the control and select gates, to the top surface of the spacer layer, and wherein the top surfaces of the spacer layer and the control gate are recessed below a top surface of the select gate; and
a sidewall layer comprising a first segment adjoining a sidewall of the select gate and a first sidewall of the spacer layer, and further comprising a second segment adjoining a second sidewall of the spacer layer, wherein the sidewall of the select gate is aligned with the first sidewall of the spacer layer, and wherein the control and select gates are arranged laterally between the first and second segments of the sidewall layer.

* * * * *